United States Patent
Xiang et al.

(10) Patent No.: US 6,825,115 B1
(45) Date of Patent: Nov. 30, 2004

(54) POST SILICIDE LASER THERMAL ANNEALING TO AVOID DOPANT DEACTIVATION

(75) Inventors: Qi Xiang, San Jose, CA (US); Robert B. Ogle, San Jose, CA (US); Eric N. Paton, Morgan Hill, CA (US); Cyrus E. Tabery, Cupertino, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/341,436

(22) Filed: Jan. 14, 2003

(51) Int. Cl.[7] .............................................. H01L 21/44
(52) U.S. Cl. ..................... 438/662; 257/660; 257/506; 257/535; 257/527; 257/301; 257/306
(58) Field of Search ................................ 438/660, 662, 438/506, 535, 527, 301, 306; 257/70, 382, 412, 755, 757

(56) References Cited

U.S. PATENT DOCUMENTS 6,365,446 B1 * 4/2002 Chong et al. ............... 438/197

OTHER PUBLICATIONS

Gregory Luckman, Michel Bruehwiler, and Robert Rathmell, "Investigating Medium–Current Tools for Indium Implantation Applications," Micro Magazine (Feb., 2001), pp. 1–12.*

S Wolf and R. N. Tauber, "Silicon Processing for the VLSI Era, vol. 1—Process Technology," Lattice Press, Sunset Bereach, CA (1986) pp. 321–325.*

* cited by examiner

*Primary Examiner*—Eddie Lee
*Assistant Examiner*—Thomas Magee

(57) ABSTRACT

Dopant deactivation, particularly at the Si/silicide interface, is avoided by forming deep source/drain implants after forming silicide layers on the substrate and activating the source/drain regions by laser thermal annealing. Embodiments include forming source/drain extensions, forming metal silicide layers on the substrate surface and gate electrode, forming preamorphized regions under the metal silicide layers in the substrate, ion implanting to form deep source/drain implants overlapping the preamorphized regions and extending deeper into the substrate then the preamorphized regions, and laser thermal annealing to activate the deep source/drain regions.

13 Claims, 3 Drawing Sheets

POST SILICIDE LASER THERMAL ANNEALING TO AVOID DOPANT DEACTIVATION

FIELD OF THE INVENTION

The present invention relates to semiconductor devices with accurately formed sub-micron features. The present invention has particular applicability in fabricating high density semiconductor devices with reduced series resistance.

BACKGROUND ART

As integrated circuit geometries continue to plunge into the deep sub-micron regime, it becomes increasingly more difficult to accurately form discreet devices on a semiconductor substrate exhibiting the requisite reliability and circuit operating speed. High performance microprocessor applications require rapid speed of semiconductor circuitry. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Implementation of salicide technology as device dimensions plunge generates various issues, notably dopant deactivation. Dopant deactivation is particularly acute at the interface between the metal silicide layers formed on the semiconductor substrate and the underlying silicon. The contact resistance at the silicon/metal silicide interface is a large component of the overall series resistance. Implementation of silicidation at elevated temperatures reduces the dopant concentration at the interface which is manifested by a high resistance.

Accordingly, there exists a need for methodology enabling the fabrication of semiconductor devices comprising transistors with improved series resistance and a significant reduction in dopant deactivation at the interface between metal silicide layers and substrate silicon.

DISCLOSURE OF THE INVENTION

An advantage of the present invention is a method of manufacturing a semiconductor device comprising transistors with reduced series resistance and high dopant concentration at the interface between metal silicide layers and underlying silicon in the substrate.

Another advantage of the present invention is a semiconductor device comprising transistors with reduced series resistance and high dopant concentration at the interface between metal silicide layers and substrate silicon.

Additional advantages and other features of the present invention will be set forth in the description which follows and in part will be apparent to those having ordinary skill in the art upon examination of the following or may be learned from the practice of the present invention. The advantages of the present 8invention may be realized and obtained as particularly pointed out in the appended claims.

According to the present invention, the foregoing and other advantages are achieved in part by a method of manufacturing a semiconductor device, the method comprising: forming a gate electrode over a main surface of a substrate with a gate dielectric layer therebetween, the gate electrode having an upper surface and side surfaces; forming shallow source/drain extensions in the substrate; forming dielectric sidewall spacers on the side surfaces of the gate electrode; forming first metal silicide layers on the main surface of the substrate adjacent dielectric sidewall spacers and a second metal silicide layer on the upper surface of the gate electrode; forming deep source/drain implants in the substrate under the first metal silicide layers; and laser thermal annealing to activate deep source/drain regions.

Another aspect of the present invention is a semiconductor device comprising: a gate electrode, having an upper surface and side surfaces, over a main surface of the substrate with a gate dielectric layer therebetween; dielectric sidewall spacers on the side surfaces of the gate electrode; shallow source/drain extensions in the substrate under the dielectric sidewall spacers; metal silicide layers on the main surface of the substrate adjacent the dielectric sidewall spacers; and deep source/drain regions extending into the substrate under the metal silicide layers, the deep source/drain regions having an upper portion with a first impurity concentration adjacent the metal silicide layers and a lower portion with a second impurity concentration, less than the first impurity concentration, extending below the upper portion.

Embodiments of the present invention comprise forming preamorphized regions extending into the substrate to a first depth below the first metal silicide layers and ion planting to form the deep source/drain implants overlapping the preamorphized regions to a second depth below the first metal silicide layers greater than the first depth. Embodiments of the present invention include forming the preamorphized regions at a first depth from the main surface of the substrate of 800 Å to 1,800 Å, and forming the deep source/drain implants at a second depth from the main surface of the substrate of 1,000 Å to 2,000 Å. Embodiments of the present invention further include laser thermal annealing by impinging a pulsed laser light beam at a radiant fluence of 0.2 to 0.8 joules/cm$^2$ for 1 to 10 nanoseconds. The resulting deep source/drain regions have an upper portion at an interface with the metal silicide layers with an impurity concentration greater than that of a lower portion extending deeper into the substrate.

Additional advantages of the present invention will be readily apparent to those skilled in the art from the following detailed description wherein the embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 5 similar features or elements are denoted by similar reference characters.

DESCRIPTION OF THE INVENTION

Figure 1:
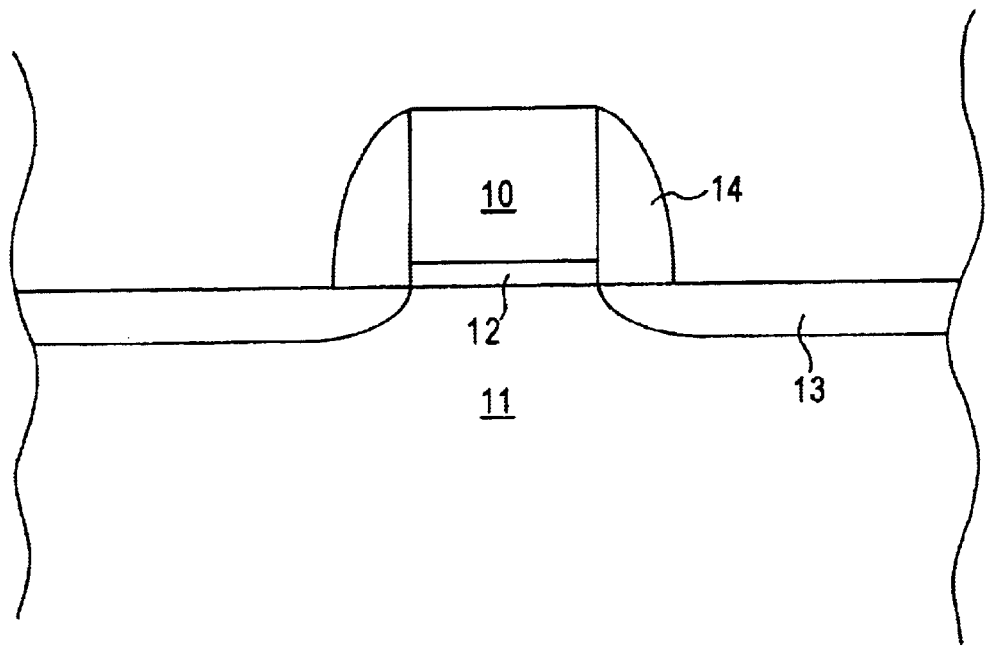
FIGS. 1 through 5 schematically illustrated sequential phases of a method in accordance with an embodiment of the present invention.

The present invention addresses and solves the problem of forming miniaturized semiconductor devices with transistors exhibiting reduced series resistance and reduced dopant deactivation at the interface between a metal silicide layers formed on the main surface of the substrate and the underlying silicon. During conventional silicidation techniques, such as salicide technology, dopants at the interface between the metal silicide layers formed on the substrate and the underlying silicon are deactivated, thereby reducing the dopant concentration at the interface and, hence, increasing contact resistance which is a large component of series resistance. The present invention addresses and solves that problem by strategically forming the deep source/drain regions subsequent to metal silicide formation and activating the deep source/drain regions by laser thermal annealing. Advantageously, peramorphized regions are initially formed under the metal silicide layers and impurities are ion implanted into the substrate surface to a depth overlapping and extending below the preamorphized regions forming source/drain implants. Upon subsequent laser thermal annealing, the supersaturated preamorphized regions with a high dopant concentration are rapidly melted and quenched or frozen, resulting in source/drain regions with a high dopant concentration, particularly at the interface between the metal silicide layers and underlying silicon.

An embodiment of the present invention is schematically illustrated in FIGS. 1 through 5. Adverting to FIG. 1, gate electrode 10, typically doped polycrystalline silicon, is formed over substrate 11, such as doped monocrystalline silicon, with a gate dielectric layer 12, such as silicon oxide, therebetween. Gate oxide layer 12 typically has a thickness of 5 Å to 20 Å. Shallow source/drain extensions 13 are then formed by ion implantation. Dielectric sidewall spacers 14 are formed on the side surfaces of gate electrode 10, such as silicon nitride at a thickness of 850 Å to 950 Å.

Figure 2:
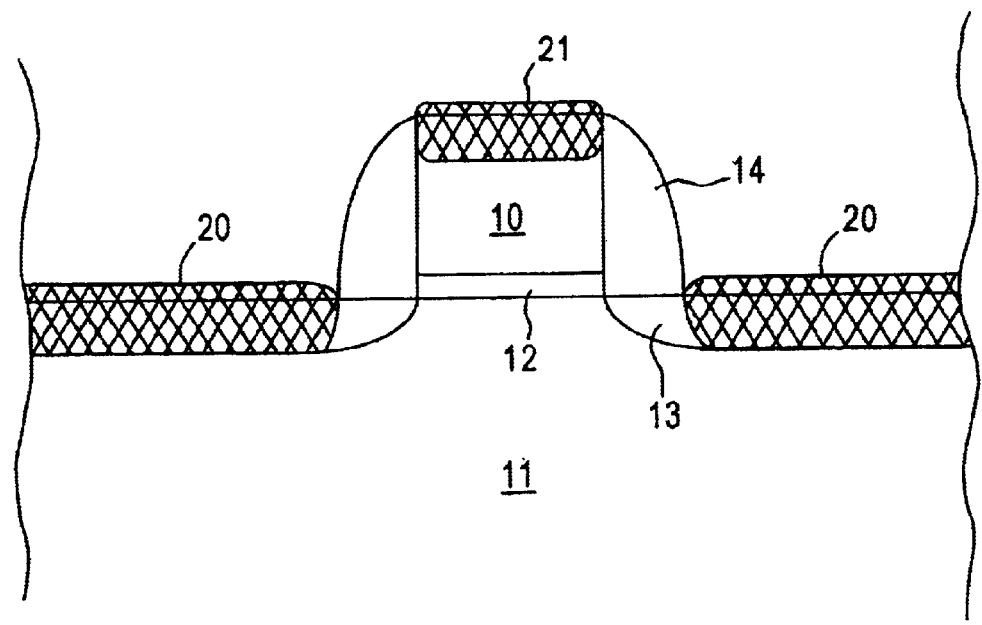
Figure 3:
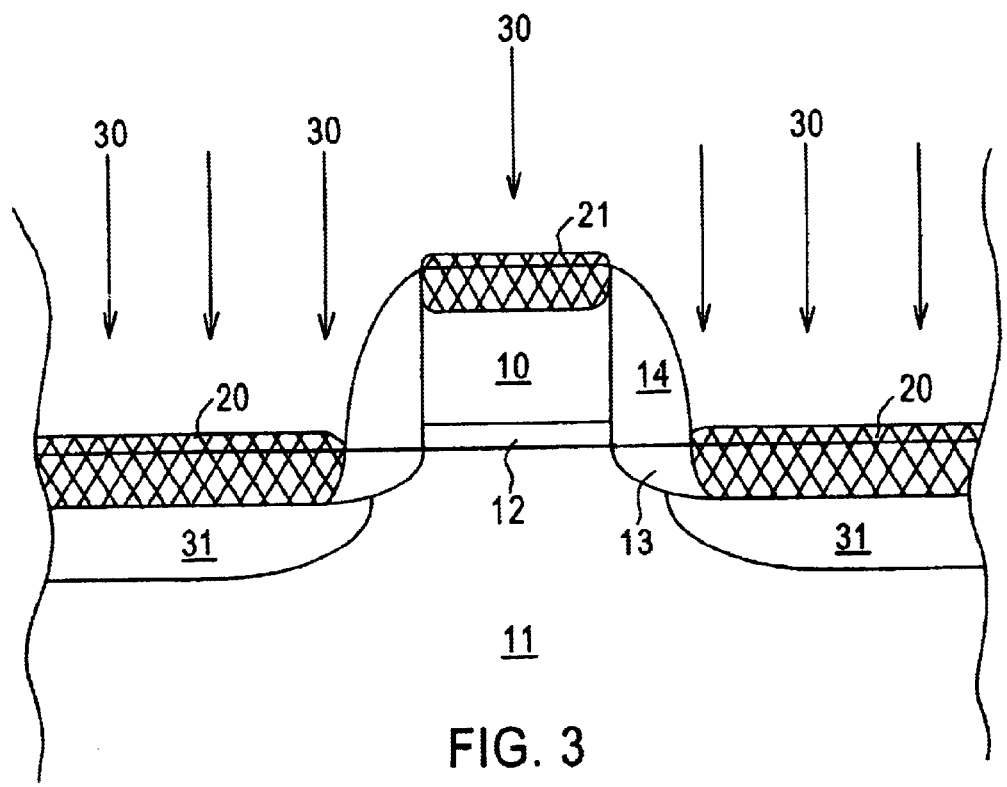

Adverting to FIG. 2, metal silicide layers 20 are formed on the main surface of substrate 11 and metal silicide layer 21 is formed on the upper surface of gate electrode 10. Metal silicide layers 20, 21 may be formed from nickel silicide, cobalt silicide or tungsten silicide, as at a thickness of 100 Å to 300 Å.

Figure 4:
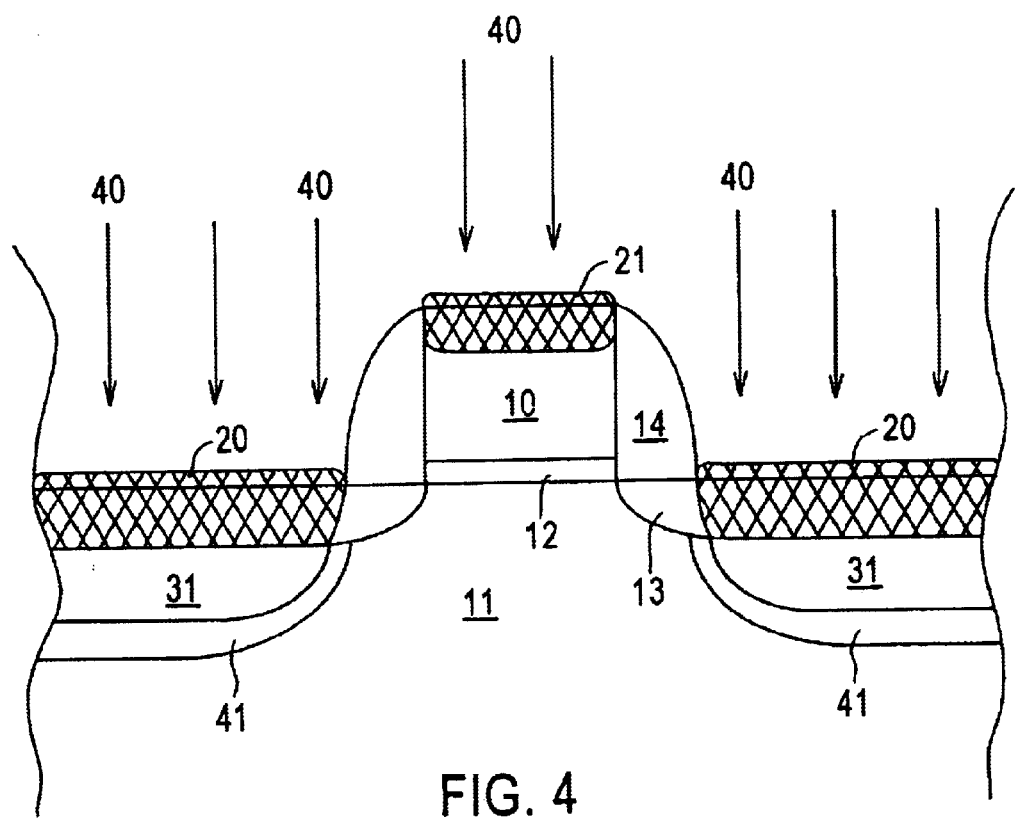

Ion implantation is conducted, as schematically illustrated by arrows 30 in FIG. 3A, to form preamorphized regions 31 extending into substrate 11 under metal silicide layers 20. Preamorphized regions 31 typically extend into the substrate to a depth of about 800 Å to 1,800 Å from the upper surface thereof. Ion implantation 30 to form preamorphized regions 31 may be implemented by ion implanting silicon (Si), germanium (Ge) or Xenon (Xe). For example, Xe may be implanted at an implantation dosage of is $1\times10^{14}$ to $5\times10^{14}$ ions/cm$^2$ at an implantation energy of 100 to 500 KeV to form preamorphized regions 31. Subsequently, as illustrated in FIG. 4, ion implantation is conducted, as illustrated by arrows 40, to form deep source/drain implants 41 extending into the substrate 11 to a depth greater than the depth of preamorphized regions 31, as to a depth of 1,000 Å to 2,000 Å from the main surface of substrate 11. Ion implantation to form deep source/drain implants 41 can be implemented by implanting an impurity such as at an implantation dosage of $1\times10^{15}$ to $1\times10^{16}$ ions/cm$^2$ at an implantation energy of 5 KeV to 30 KeV.

Figure 5:
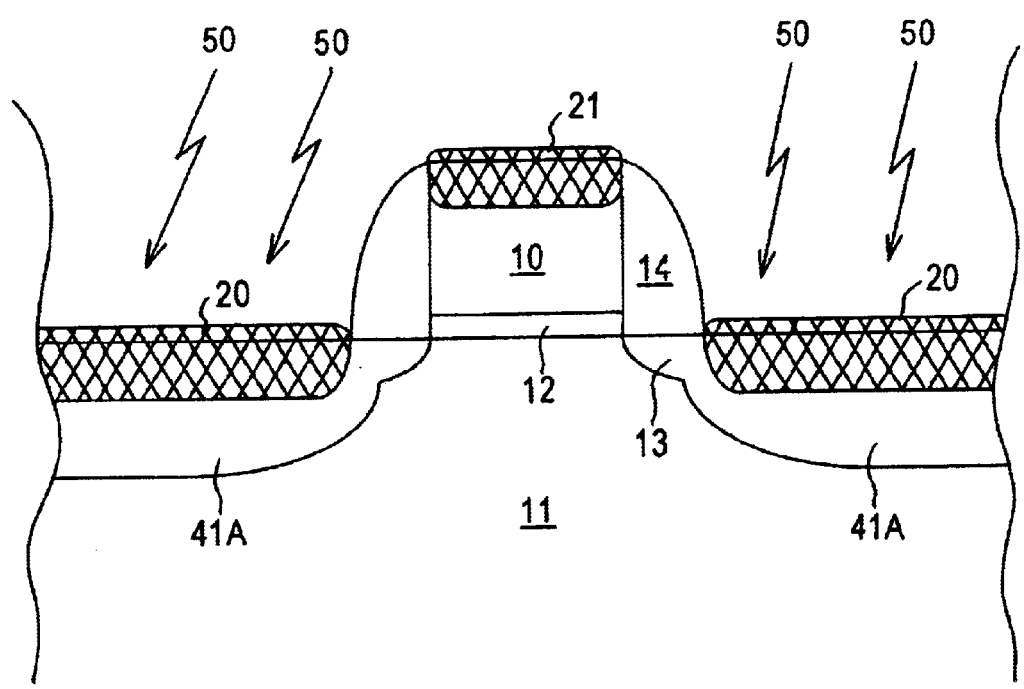

Subsequently, laser thermal annealing is implemented, as illustrated by arrows 50 in FIG. 5, to recrystalize preamorphized regions 31 and to activate implants 41 into deep source/drain regions 41A. Such laser thermal annealing may be implemented by impinging a pulsed laser light beam at a radiant fluence of 0.2 to 0.8 Joules/cm$^2$ for 1 to 10 nanoseconds, thereby elevating the substrate temperature to 1,200° C. to 1,300° C. followed by rapid quenching. During such rapid heating and cooling, the highly concentrated supersaturated implanted preamorphized regions 31 are frozen such that the high impurity concentration of the deep source/drain regions 41 is maintained, particularly at the interface with the metal silicide layers 20, while the impurity concentration is somewhat less in the activated portion of the implant that extended below the preamorphized regions deeper into the substrate. Typically, the impurity concentration of the deep source/drain regions 41 at the interface with metal silicide layers 41 is $1\times10^{19}$ to $1\times10^{20}$ atom/cm$^3$, while the impurity concentration of deep source/drain regions 41A deeper into the substrate is $1\times10^{17}$ to $1\times10^{18}$ atom/cm$^3$.

The present invention provides methodology enabling the fabrication of highly miniaturized semiconductor devices with reduced series resistance by strategically forming deep source/drain regions subsequent to silicidation. The combination of preamorphization and laser thermal annealing enables the formation of deep source/drain regions with high activated dopant concentrations at the interface with the metal silicide layers, thereby reducing contact resistance and improving series resistance.

The use of a laser thermal annealing enables pinpoint accuracy in targeting specific areas of the substrate, thereby avoiding unnecessarily elevating the temperature of other portions of the way for causing various problems, such as defects and diffusions issues. In implementing embodiments of the present invention, any of various commercially available laser tools may be employed, such as those utilizing a laser source capable of operating at energies of about 10 to about 2,000 mJ/cm$^2$/pulse, e.g., about 100 to 400 mJ/cm$^2$/pulse. Commercially available tools exist which can perform such laser annealing, either with or without a mask. The Verdant Technologies laser anneal tool is but an example and operates at an exposure wavelength of 308 nm.

The present invention enjoys industrial applicability in fabricating various types of highly miniaturized semiconductor devices with improved reliability and high operating speed. The present invention has particular applicability in fabricating semiconductor device with design features in the deep submicron regime, as with a design rule of about 0.12 micron and under, with significant improved reliability and improved manufacturing throughput.

In the preceding detailed description, the present invention is described with reference to specific exemplary embodiments thereof. It will, however, be evident that various modification and changes may be made thereto, without departing from the broader scope of the present invention, as set forth in the claims. The specification and drawings are, accordingly, to be regarded as illustrative and not as restrictive. It is understood that the present invention is capable of using various other combinations and environments and is capable of changes or modifications within the scope of the inventive concept as expressed herein.

What is claimed is:

1. A method of manufacturing a semiconductor device, the method comprising sequentially:

forming a gate electrode over a main surface of a substrate with a gate dielectric layer therebetween, the gate electrode having an upper surface and side surfaces;

forming shallow source/drain extensions in the substrates;

forming dielectric sidewall spacers on the side surfaces of the gate electrode;

forming first metal silicide layers on the main surface of the substrate adjacent the dielectric sidewall spacers and a second metal silicide layer on the upper surface of the gate electrode; and forming deep source/drain implants in the substrate under the first metal silicide layers by:

forming preamorphized regions extending to a first depth from the main surface of the substrate to below the first metal silicide layers; and ion implanting to form the deep source/drain implants overlapping the preamorphized regions and extending to a second depth from the main surface of the substrate to below the first metal silicide layers.

2. The method according to claim 1, comprising:

ion implanting to form the deep source/drain implants at the second depth greater than the first depth.

3. The method according to claim 2, comprising:

forming the preamorphized regions at the first depth of 800 Å to 1,800 Å; and forming the deep source/drain implants at the second depth of 1,000 Å to 2,000 Å.

4. The method according to claim 2, comprising laser thermal annealing by impinging a laser light beam at a radiant fluence of 0.2 to 0.8 joules/cm$^2$ for 1 to 10 nanoseconds.

5. The method according to claim 2, comprising laser thermal annealing to activate deep source/drain regions extending from the main surface of the substrate under the metal silicide layers, the deep source/drain regions having an upper portion with a first activated impurity concentration adjacent the metal silicide layers and a lower portion with a second activated impurity concentration, less than the first activated impurity concentration, extending below the upper portion.

6. The method according to claim 5, wherein:

the first activated impurity concentration is $1\times10^{19}$ to $1\times10^{20}$ atom/cm$^3$; and the second activated impurity concentration is $1\times10^{17}$ to $1\times10^{18}$ atom/cm$^3$.

7. A semiconductor device comprising:

a gate electrode, having an upper surface and side surfaces, over a main surface of a substrate with a gate dielectric layer therebetween;

dielectric sidewall spacers on the side surfaces of the gate electrode;

shallow source/drain extensions in the substrate under the dielectric sidewall spacers;

metal silicide layers on the main surface of the substrate adjacent the dielectric sidewall spacers; and deep source/drain regions extending into the substrate under the metal silicide layers, the deep source/drain regions having an upper portion with a first activated impurity concentration adjacent the metal silicide layers and a lower portion with a second activated impurity concentration, less than the first activated impurity concentration, extending below the upper portion, wherein:

the first activated impurity concentration is $1\times10^{19}$ to $1\times10^{20}$ atom/cm$^3$; and the second activated impurity concentration is $1\times10^{17}$ to $1\times10^{18}$ atom/cm$^3$.

8. A method of manufacturing a semiconductor device, the method comprising:

forming a gate electrode over a main surface of a substrate with a gate dielectric layer therebetween, the gate electrode having an upper surface and side surfaces;

forming shallow source/drain extensions in the substrates;

forming dielectric sidewall spacers on the side surfaces of the gate electrode;

forming first metal silicide layers on the main surface of the substrate adjacent the dielectric sidewall spacers and a second metal silicide layer on the upper surface of the gate electrode; and forming deep source/drain implants in the substrate under the first metal silicide layers by;

forming preamorphized regions extending to a first depth from the main surface of the substrate to below the first metal silicide layers; and ion implanting to form the deep source/drain implants overlapping the preamorphized regions and extending to a second depth from the main surface of the substrate to below the first metal silicide layers.

9. The method according to claim 8, comprising:

ion implanting to form the deep source/drain implants at the second depth greater than the first depth.

10. The method according to claim 9, comprising:

forming the preamorphized regions at the first depth of 800 Å to 1,800 Å; and forming the deep source/drain implants at the second depth of 1,000 Å to 2,000 Å.

11. The method according to claim 9, comprising laser thermal annealing by impinging a laser light beam at a radiant fluence of 0.2 to 0.8 joules/cm$^2$ for 1 to 10 nanoseconds.

12. The method according to claim 9, comprising laser thermal annealing to activate deep source/drain regions extending from the main surface of the substrate under the metal silicide layers, the deep source/drain regions having an upper portion with a first activated impurity concentration adjacent the metal silicide layers and a lower portion with a second activated impurity concentration, less than the first activated impurity concentration, extending below the upper portion.

13. The method according to claim 12, wherein:

the first activated impurity concentration is $1\times10^{19}$ to $1\times10^{20}$ atom/cm$^3$; and the second activated impurity concentration is $1\times10^{17}$ to $1\times10^{18}$ atom/cm$^3$.

* * * * *